US009023422B1

(12) United States Patent
Sridhar et al.

(10) Patent No.: US 9,023,422 B1
(45) Date of Patent: May 5, 2015

(54) HIGH RATE DEPOSITION METHOD OF MAGNETIC NANOCOMPOSITES

(75) Inventors: Uppili Sridhar, Morgan Hill, CA (US); Joseph Paul Ellul, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 251 days.

(21) Appl. No.: 13/596,983

(22) Filed: Aug. 28, 2012

Related U.S. Application Data

(60) Provisional application No. 61/529,704, filed on Aug. 31, 2011.

(51) Int. Cl.
  G11B 5/66 (2006.01)
  H01L 39/24 (2006.01)
  H01L 21/316 (2006.01)

(52) U.S. Cl.
  CPC .................................... *H01L 21/3165* (2013.01)

(58) Field of Classification Search
  None
  See application file for complete search history.

(56) References Cited

U.S. PATENT DOCUMENTS

| 3,791,852 | A | * | 2/1974 | Bunshah ........................ 427/567 |
| 4,861,750 | A | * | 8/1989 | Nogawa et al. ............... 505/473 |
| 5,608,593 | A | * | 3/1997 | Kim et al. ................. 360/324.12 |
| 6,402,904 | B1 | * | 6/2002 | Baldwin et al. ........... 204/192.13 |
| 2003/0235717 | A1 | * | 12/2003 | van de Veerdonk et al. .. 428/694 TM |
| 2005/0000444 | A1 | * | 1/2005 | Hass et al. ............. 118/723 EB |

OTHER PUBLICATIONS

Coonley, Kip D., et al., "Evaporatively Deposited Co-MgF$_2$ Granular Materials for Thin-Film Inductors", *IEEE Transactions on Magnetics*, vol. 36, No. 5, (Sep. 2000), pp. 3463-3465.

Itoh, T. , et al., "Magnetic Softness of Permalloy Granular Films Produced by Co-Evaporation", *IEEE Transactions on Magnetics*, vol. 41, No. 10, (Oct. 2005), pp. 3274-3276.

Shimada, Yutaka , et al., "Granular Thin Films with High RF Permeability", *INTERMAG, IEEE International Magnetics Conference*, (Mar. 28-Apr. 3, 2003), pp. FC-01.

Shimada, Yutaka , et al., "Magnetic Softness of Permalloy Granular Films Produced by Co-Evaporation", *INTERMAG, Digest of the IEEE International Magnetics Conference*, (Apr. 4-8, 2005), pp. 303-304.

* cited by examiner

*Primary Examiner* — Mandy Louie
(74) *Attorney, Agent, or Firm* — Blakely Sokoloff Taylor & Zafman LLP

(57) ABSTRACT

A method of deposition of magnetic nanocomposites. The method comprises providing an electron beam evaporation system having at least two independent hearths with independently controllable electron beams, each to melt and evaporate materials in the respective hearth, each hearth having a respective shutter for selectively controlling the deposition of the respective material in the respective hearth, placing a ferromagnetic material in a first hearth, placing an oxide in a second hearth which, when evaporated and deposited, will form an insulator, maintaining an oxygen environment in the electron beam evaporation system while evaporating the materials in the first hearth and second hearth, and depositing the magnetic nanocomposite on at least one wafer in the electron beam evaporation system. Various aspects of the method are disclosed.

21 Claims, 3 Drawing Sheets

20 nH (left) and 200 nH (right) micro-inductors in a 2.5 mm² footprint

HIGH RATE DEPOSITION METHOD OF MAGNETIC NANOCOMPOSITES

CROSS-REFERENCE TO RELATED APPLICATIONS

This application claims the benefit of U.S. Provisional Patent Application No. 61/529,704 filed Aug. 31, 2011.

BACKGROUND OF THE INVENTION

1. Field of the Invention

The present invention relates to the deposition of magnetic nanocomposite materials.

2. Prior Art

Magnetic nanocomposite materials are highly desired as core materials in advanced power inductor technology. Advanced magnetic core materials are needed to form inductors which can work at the high frequencies of up to 100 MHz. Soft magnetic nanocomposite based magnetic cores show excellent performance with low loss and high saturation magnetization at these frequencies and have been demonstrated in research laboratories. Currently used methods for forming magnetic nanocomposite materials involve sputtering from alloy or multiple targets in a reactive gas environment. Deposition rates are typically 1 um/hour. Typical thicknesses needed for efficient inductor core operation under high DC currents are about 10 um to 50 um. The current process can take up to a few days, resulting in a device technology that is not manufacturable in quantity on a cost effective basis. Also the prior art solution addresses only co evaporation of ferromagnetic material with fluorides, which are not good insulators compared to oxides. Further useful thick films could not be grown because of columnar growth causing unwanted perpendicular anisotropy.

DETAILED DESCRIPTION OF THE PREFERRED EMBODIMENTS

The present invention seeks to address the prior art deficiencies by means of a high rate deposition process using electron beam evaporation. Electron beam evaporation from multiple hearths is a well known technology which can yield high deposition rates of up to a few microns/minute. Highly automated tools are available also which make the process very attractive for fast through-put systems.

Figure 1:
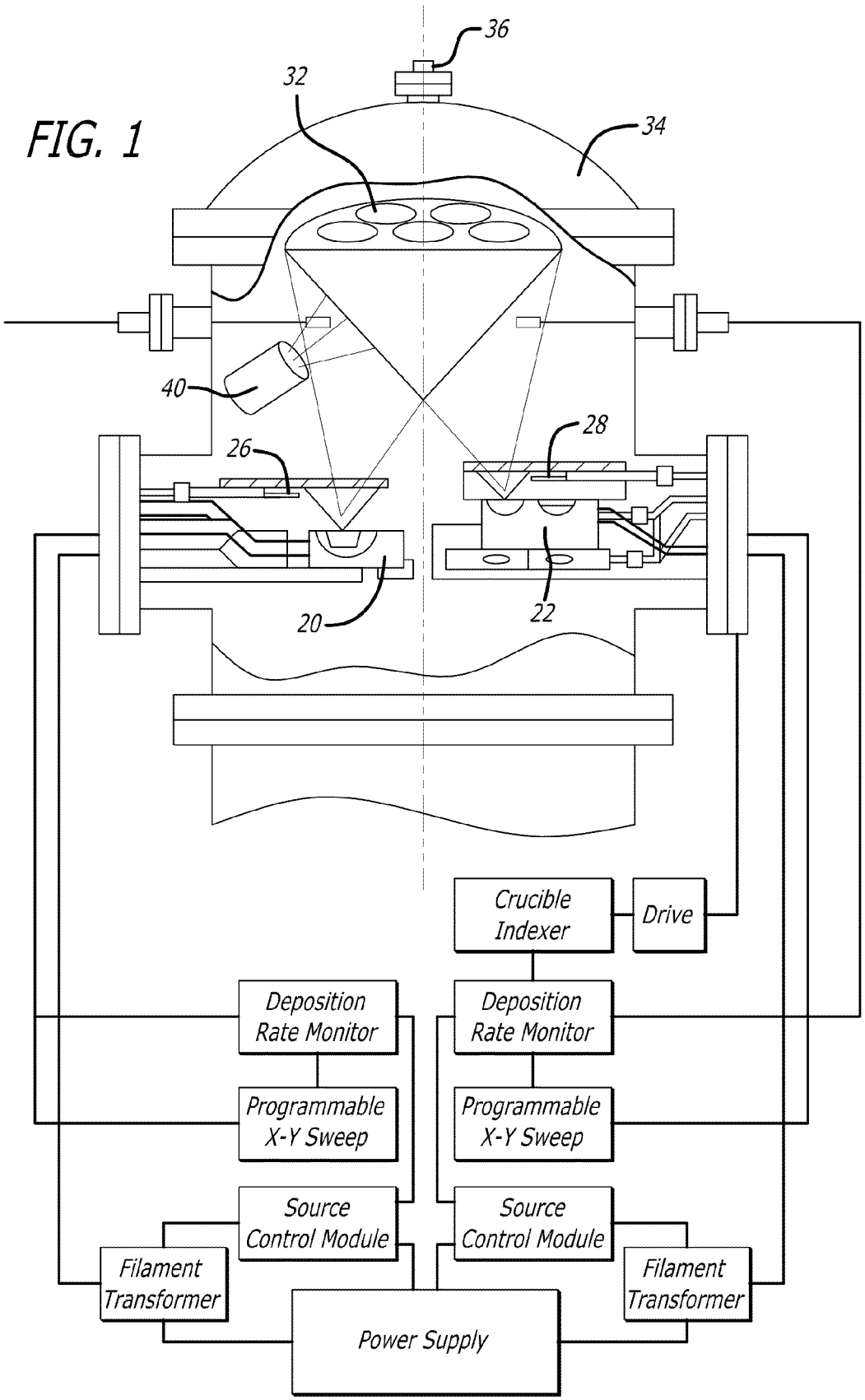
FIG. 1 is a schematic illustration of a typical 2 hearth evaporator.
Figure 2:
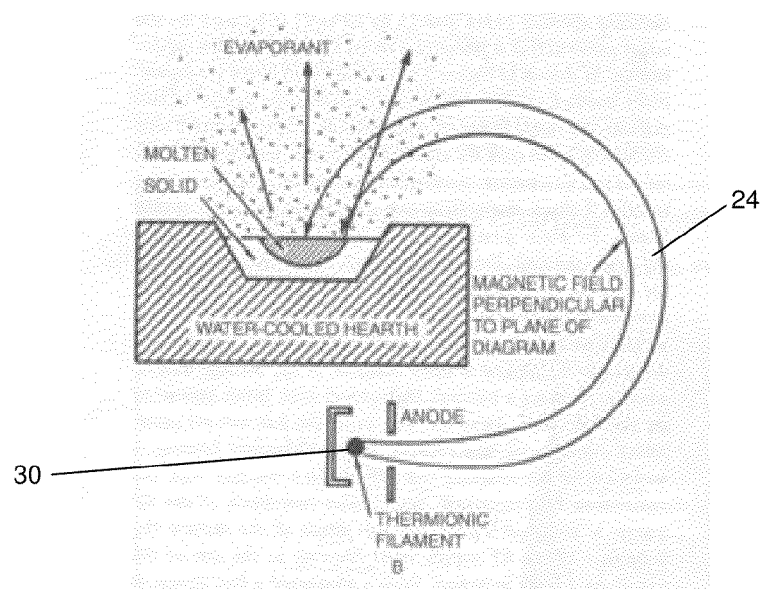
FIG. 2 illustrates the easy axis and hard axis characteristics of an exemplary magnetic nanocomposite material.

FIG. 1 is a schematic illustration of a typical two hearth evaporator. In one embodiment, the evaporator is an adaptation of a typical Ferrotec-Temescal dual electron source evaporator. The electron beam high rate evaporation system consists of two independent hearths 20 and 22 with electron beams (a typical electron beam 24 being illustrated in FIG. 2) being independently controllable to melt and evaporate the materials of interest. This type of system allows for co-evaporation of two independent streams of evaporant materials with differing vapor pressures and melting points. Also independent shutters 26 and 28 allow for selectively controlling the deposition by allowing evaporation and deposition (shutter open) and preventing evaporation and deposition (shutter closed) of the material therein.

The evaporant charges are typically filled into Copper hearths directly or loaded into graphite crucibles which in turn are inserted into the water cooled Copper hearths 20, 22. On heating with an intense electron beam 24 generated by a thermionic emitter 30 under a vacuum, the material melts and evaporates. Several wafers 32 are assembled into a holder in dome 34 about 30 cms to 50 cms away from the hearth. The holder is rotated around an axis 36 or in a planetary motion to achieve uniformity of the deposited material.

Mixtures can be deposited with controlled stoichiometry by controlling rates of evaporation of the materials independently. Alternatively, alternate layers of materials can also be deposited by selective shuttering using shutters 26 and 28. The entire operation is or can be completely automated.

For magnetic composite material deposition, reactive evaporation is conveniently used in the present invention. A low pressure of $O_2$ (~0.1 mTorr) is maintained in the system during evaporation. Typical materials evaporated include oxides and nitrides of Zr, Hf, Al and Si, to name a few. Magnetic materials evaporated are Co, Fe, and Ni and alloys thereof such as Fe/Co, etc. $O_2$ preferentially reacts with Zr or Hf rather than the magnetic materials due the formers' higher affinity for oxide formation to assure that the insulator is fully oxidized.

High rates of deposition can be obtained by increasing electron beam 24 power used to melt the evaporant charges. Typically 10 kW to 50 kW power supplies are used. Moreover, typically 12 to 18-200 mm diameter wafers can be deposited at a time. This factor also serves to increase wafer throughput.

Figure 3:
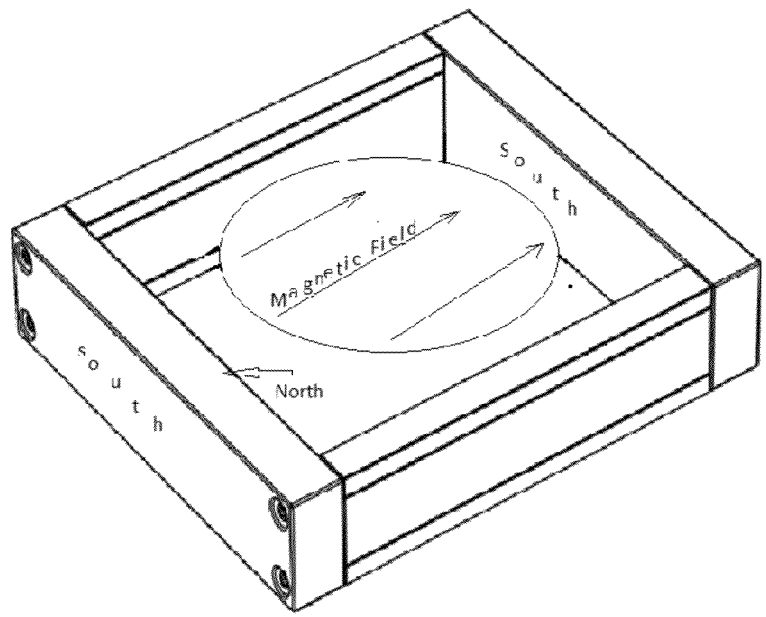
FIG. 3 illustrates an exemplary magnetic orientation fixture for orienting the magnetic characteristics of the nanocomposite material.
Figure 4:
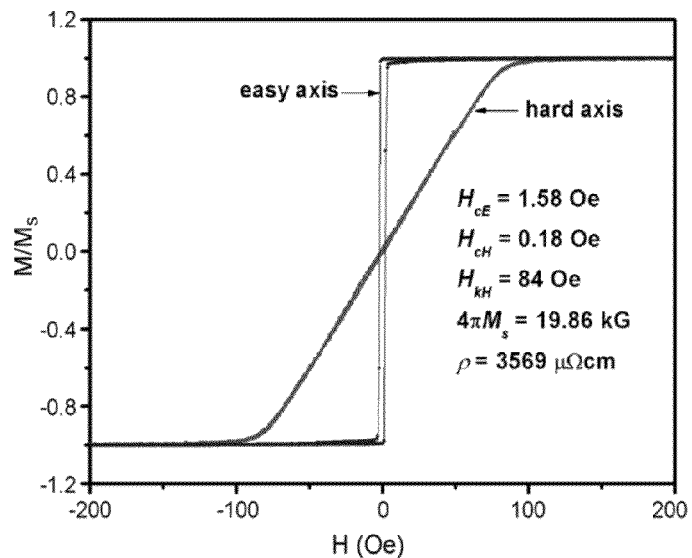
FIG. 4 illustrates the BH characteristics from magnetic orientation resulting from use a magnetic orientation fixture of the type illustrated in FIG. 3.

The innovations herein result from the use of this high throughput system to deposit a few um of soft magnetic material per minute (at least greater than one um per minute) on ~12 wafers. As noted before, commercial machines are available that may be adapted for this use. In addition, one can use an in situ magnetic orientation fixture around every wafer (FIG. 3) to uniformly orient the magnetization in fixed easy axis directions. This will enable very efficient utilization of the film for pot core type inductors. In particular, FIG. 4 illustrates the easy axis and hard axis characteristics of an exemplary magnetic nanocomposite material deposited in an orienting magnetic field.

The magnetic nanogranular film deposited is a two component system of ferromagnetic metal nanoparticles (Fe, Co, Ni and alloys thereof) in a nitride or oxide insulator matrix. The nanoparticles are <20 nm in size and need to be packed ~30 nm apart in an insulator. This combination gives moderate permeability, high saturation magnetization, low coercivity, and high resistivity, which results in low loss, high performance cores. As stated before, the thickness needs to be about 10 um to 50 um for high saturation current.

One important aspect of the method of the present invention is the periodic shuttering of the magnetic material and deposition of a thin layer of only insulation, and then reopening the shutter to again deposit the ferromagnetic nanoparticles in the insulator. This technique helps break up or reduce any tendency for columnar growth of magnetic particles.

With columnar growth, an unwanted perpendicular magnetization of magnetic domains occurs which result in low permeability and hysteretic magnetic losses in plane. Typical films deposited are $CoZrO_2$, $(Fe:CO)HfO_2$, $CoSiO_2$, $CoMgF_2$ nanogranular composite films which show excellent soft magnetic properties at high frequencies (~50 MHz). Ion beam assist by ion gun 40 using $O_2$ or $N_2$ or Ar during evaporation also can give rise to novel film properties. This will be used to control stress, deactivate columnar growth and improve film adhesion to the substrates. Ar can also be used with some oxides and nitrides where loss of stoichiometry is not severe during evaporation (e.g. Zr Oxide).

Figure 5:
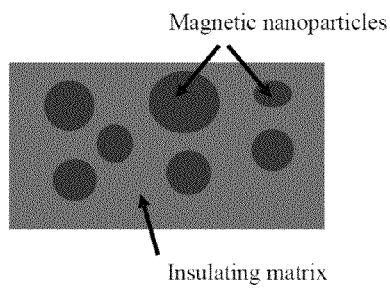
FIG. 5 illustrates typical magnetic nanoparticles in an insulating matrix.
Figure 6:
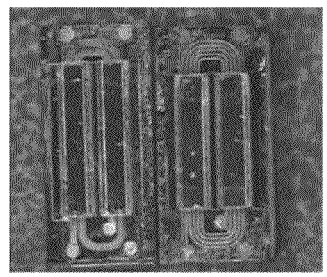
FIG. 6 illustrates typical micro-inductors that may be fabricated with the methods of the present invention.

Thus in accordance with the present invention, two independent hearths are used for co-evaporation of ferromagnetic material and insulator material. Independent shutters provide selective deposition, and insulating laminations can be incorporated periodically to reduce eddy current loss. A low pressure of $O_2$ (~0.1 mTorr) is maintained in the system during evaporation, and multiple ~200 mm dia wafers (at least greater than 100 mm dia) can be mounted in the system dome. Magnetic orientation fixtures can be fixed in the dome around wafers to grow magnetically an-isotropic films. A low voltage end-Hall type ion gun 40 is used to generate a divergent beam of ~100 eV $O_2$ or $N_2$ ions (lamp to 5 amp current) illuminating the wafers during deposition. Precise control of film stress is possible, and nanoparticle columnar growth is disrupted by the ion beam. Deposition rates up to a few microns per minute are possible by adapting commercially available equipment. Typical magnetic nanoparticles in an insulating matrix are illustrated in FIG. 5, with typical micro-inductors that may be fabricated with this method being illustrated in FIG. 6.

Thus the invention comprises an evaporation technique for high rate deposition of soft magnetic nano granular films using co-evaporation with electron beam evaporation of nano granular films and with ion assist for enhancing magnetic, mechanical and electrical properties. The magnetic properties are enhanced by preventing columnar growth, which typically occurs in high rate film deposition, by the judicious use of ion beam assist using Argon, Nitrogen or oxygen beams for depositing insulating oxides or nitrides of Si, Zr, Al, Hf etc. mixed with magnetic particles of Fe, Ni or Co, and alloys thereof. The mechanical properties are also enhanced by reduction of stress and improvement of adhesion of such films to underlying substrates by the bombarding ions of Ar, O or N. Reduction of stress also results in higher quality soft magnetic films by the reduction of magneto striction effects. The electrical properties are improved by shuttering periodically to incorporate laminations of insulating layers. This serves to lower eddy current induced losses in the films due to inplane varying magnetic fields.

Thus the present invention eliminates problems of grain growth and spurious domain formation in thick films using a separate ion beam, provides fast deposition of up to a few microns per minute by easily scaled large hearth e beam systems, and provides precise thickness control and lamination of cores by periodic shuttering of selected evaporant films, resulting in a high throughput magnetic nanogranular film deposition method with control of spurious growths.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:

1. A method of deposition of magnetic nanocomposite comprising:

providing an electron beam evaporation system having at least two independent hearths with independently controllable electron beams, each to melt and evaporate materials in the respective hearth, at least the first hearth having a respective shutter for selectively controlling the deposition of a ferromagnetic material in the first hearth;

placing a ferromagnetic material in the first hearth;

placing an oxide or nitride in the second hearth which, when evaporated and deposited, will form an insulator;

maintaining an argon, oxygen or nitrogen environment in the electron beam evaporation system while evaporating the materials in the first hearth and second hearth;

depositing the magnetic nanocomposite on at least one wafer in the electron beam evaporation system by simultaneously evaporating and depositing the ferromagnetic particles and the oxide or nitride onto a wafer while using ion beam assist for enhancing magnetic, mechanical and electrical properties of the magnetic nanocomposite; and periodically closing the shutter on the first hearth to provide alternate layers of nanoparticles in an insulator and layers of insulator.

2. The method of claim 1 wherein the alternate layers of nanoparticles in an insulator and layers of insulator are deposited to prevent columnar growth of magnetic particles.

3. The method of claim 1 wherein the material in the second hearth is selected to have a greater affinity for oxygen than the ferromagnetic material in the first hearth.

4. The method of claim 3 wherein the material in the second hearth is an oxide or nitride selected from the group consisting of Zr, Hf, Al and Si.

5. The method of claim 1 wherein the magnetic nanocomposites are deposited on a plurality of wafers simultaneously.

6. The method of claim 1 wherein the ferromagnetic material deposited is selected from the group consisting of $CoZrO_2$, $(Fe:CO)HfO_2$, $CoSiO_2$ and $CoMgF_2$.

7. The method of claim 1 wherein the rate of deposit of magnetic nanocomposite is at least greater than one micron per minute.

8. The method of claim 1 wherein the magnetic nanocomposite comprises nanoparticles <20 nm in size packed approximately 30 nm apart in the insulator.

9. A method of deposition of magnetic nanocomposite comprising:

providing an electron beam evaporation system having at least two independent hearths with independently controllable electron beams, each to melt and evaporate materials in the respective hearth, at least the first hearth having a respective shutter for selectively controlling the deposition of a ferromagnetic material in the first hearth;

placing a ferromagnetic material in the first hearth;

placing an oxide or nitride in the second hearth which, when evaporated and deposited, will form an insulator;

maintaining an argon, oxygen or nitrogen environment in the electron beam evaporation system while evaporating the materials in the first hearth and second hearth; and depositing the magnetic nanocomposite on at least one wafer in the electron beam evaporation system by simultaneously evaporating and depositing ferromagnetic particles and the oxide or nitride onto a wafer;

wherein the shutter on the first hearth is periodically closed to provide alternate layers of nanoparticles in an insulator and layers of insulator.

10. The method of claim 9 wherein the alternate layers of nanoparticles in an insulator and layers of insulator are deposited to prevent columnar growth of magnetic particles.

11. The method of claim 9 wherein the material in the second hearth is selected to have a greater affinity for oxygen than the ferromagnetic material in the first hearth.

12. The method of claim 11 wherein the material in the second hearth is an oxide or nitride selected from the group consisting of Zr, Hf, Al and Si.

13. The method of claim 9 wherein the magnetic nanocomposites are deposited on a plurality of wafers simultaneously.

14. The method of claim 9 further comprising using an in situ orientation fixture during deposition to uniformly orient a magnetization in the magnetic nanocomposites in fixed easy axis and hard axis orientations.

15. The method of claim 9 wherein between 10 to 50 microns of magnetic nanocomposite is deposited on multiple wafers.

16. The method of claim 9 wherein the rate of deposit of magnetic nanocomposite is at least greater than one micron per minute.

17. The method of claim 16 further comprising using an in situ orientation fixture during deposition to uniformly orient a magnetization in the magnetic nanocomposites in fixed easy axis and hard axis orientations.

18. The method of claim 9 wherein the magnetic nanocomposite comprises nanoparticles <20 nm in size packed approximately 30 nm apart in the insulator.

19. The method of claim 9 wherein the ferromagnetic material deposited is selected from the group consisting of $CoZrO_2$, $(Fe:CO)HfO_2$, $CoSiO_2$ and $CoMgF_2$.

20. The method of claim 9 wherein electron beam assist is used during evaporation.

21. The method of claim 9 further comprising using a low voltage end-Hall type ion gun to generate a divergent ion beam illuminating the wafers during deposition.

* * * * *